(12) United States Patent
Zhang

(10) Patent No.: US 12,256,531 B2
(45) Date of Patent: Mar. 18, 2025

(54) METHOD FOR FORMING BURIED BIT LINES IN THE BIT LINE TRENCHS

(71) Applicant: CHANGXIN MEMORY TECHNOLOGIES, INC., Hefei (CN)

(72) Inventor: Kui Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 452 days.

(21) Appl. No.: 17/867,432

(22) Filed: Jul. 18, 2022

(65) Prior Publication Data

US 2023/0089265 A1    Mar. 23, 2023

Related U.S. Application Data

(63) Continuation of application No. PCT/CN2022/072418, filed on Jan. 17, 2022.

(30) Foreign Application Priority Data

Sep. 14, 2021    (CN) .......................... 202111074102.4

(51) Int. Cl.
*H10B 12/00* (2023.01)
*H10D 30/63* (2025.01)

(52) U.S. Cl.
CPC .......... *H10B 12/053* (2023.02); *H10B 12/34* (2023.02); *H10B 12/482* (2023.02); *H10B 12/488* (2023.02); *H10D 30/63* (2025.01)

(58) Field of Classification Search
CPC .... H10B 12/48; H10B 12/482; H10B 12/485; H10B 12/488

USPC ........................................ 257/906, 907, 908
See application file for complete search history.

(56) References Cited

U.S. PATENT DOCUMENTS

| | | | |
|---|---|---|---|
| 6,891,225 B2 | 5/2005 | Horiguchi | |
| 8,222,110 B2 | 7/2012 | Kim | |
| 8,569,831 B2 | 10/2013 | Heineck | |
| 8,871,589 B2 | 10/2014 | Heineck | |
| 8,936,982 B2 | 1/2015 | Cho | |
| 9,318,493 B2 | 4/2016 | Heineck | |
| 10,734,388 B1 | 8/2020 | Karda | |
| 2002/0034855 A1 | 3/2002 | Horiguchi | |

(Continued)

FOREIGN PATENT DOCUMENTS

| | | |
|---|---|---|
| CN | 1344029 A | 4/2002 |
| CN | 101673744 A | 3/2010 |

(Continued)

*Primary Examiner* — Hoai V Pham
(74) *Attorney, Agent, or Firm* — Syncoda LLC; Feng Ma

(57) ABSTRACT

A semiconductor structure and a forming method thereof are provided. The method for forming a semiconductor structure includes providing a base including a semiconductor substrate and a well region located on a surface of the semiconductor substrate, in which the well region includes a plurality of active pillar columns arranged at intervals along a first direction, and each of the active pillar columns includes a plurality of active pillars arranged at intervals along a second direction, in which the first direction is perpendicular to the second direction; forming a plurality of bit line trenches by etching at least the well region and a partial thickness of the semiconductor substrate at bottoms of the active pillars; and forming buried bit lines in the bit line trenches.

13 Claims, 30 Drawing Sheets

(56) References Cited

U.S. PATENT DOCUMENTS

| | | |
|---|---|---|
| 2010/0244110 A1* | 9/2010 | Kim .................. H10B 12/053 257/296 |
| 2011/0003447 A1 | 1/2011 | Kim |
| 2012/0299088 A1 | 11/2012 | Heineck |
| 2014/0017865 A1 | 1/2014 | Heineck et al. |
| 2014/0061746 A1 | 3/2014 | Cho et al. |
| 2015/0014766 A1 | 1/2015 | Heineck et al. |
| 2015/0091070 A1 | 4/2015 | Cho et al. |
| 2016/0086957 A1 | 3/2016 | Cho et al. |

FOREIGN PATENT DOCUMENTS

| | | |
|---|---|---|
| CN | 101944508 A | 1/2011 |
| CN | 103681510 A | 3/2014 |
| CN | 110957319 A | 4/2020 |
| CN | 111211170 A | 5/2020 |

* cited by examiner

METHOD FOR FORMING BURIED BIT LINES IN THE BIT LINE TRENCHS

CROSS-REFERENCE TO RELATED APPLICATIONS

This application is a continuation application of International Application No.: PCT/CN2022/072418 filed on Jan. 17, 2022, which claims priority to Chinese Patent Application No. 202111074102.4, filed on Sep. 14, 2021. The disclosures of the aforementioned applications are hereby incorporated by reference in their entirety.

BACKGROUND

Dynamic random access memory (DRAM) is a semiconductor memory device commonly used in computers. DRAM is composed of many repeated memory cells. Each memory cell includes a transistor and a capacitor. The gate of the transistor is connected to a word line, the drain of the transistor is connected to a bit line, and the source of the transistor is connected to the capacitor. A voltage signal on the word line can control the transistor to turn on or turn off, and then read the data information stored in the capacitor through the bit line, or write the data information into the capacitor through the bit line for storage.

In related art, a source or a drain of a transistor in a DRAM cell is usually formed on the surface of the semiconductor substrate. Therefore, bit lines of the DRAM are also formed on the surface of the semiconductor substrate, so that the current demand for high integration of semiconductor devices cannot be met. In addition, because bit lines are located on the surface of the semiconductor substrate, the control ability of the bit lines is weak. In addition, the structure and the manufacturing process of bit lines in related art are complex, which further increases the production cost of semiconductor devices.

SUMMARY

The disclosure relates to the technical field of semiconductors, and relates to but is not limited to a semiconductor structure and a forming method thereof.

In view of the above, the embodiments of the disclosure provide a semiconductor structure and a method for forming the same.

In the first aspect, the embodiments of the disclosure provide a method for forming a semiconductor structure, the method including the following operations.

A base is provided, which includes a semiconductor substrate and a well region located on a surface of the semiconductor substrate, in which the well region includes a plurality of active pillar columns arranged at intervals along a first direction, and each of the active pillar columns includes a plurality of active pillars arranged at intervals along a second direction, in which the first direction is perpendicular to the second direction.

A plurality of bit line trenches are formed by etching at least the well region located and a partial thickness of the semiconductor substrate at the bottom of each active pillar.

Buried bit lines are formed in the bit line trenches.

In the second aspect, embodiments of the disclosure provide a semiconductor structure. The semiconductor structure is formed by the above mentioned method for forming a semiconductor structure. The semiconductor structure includes: a base, including a semiconductor substrate and a well region located on the surface of the semiconductor substrate, in which the well region includes a plurality of active pillar columns arranged at intervals along a first direction, and each of the active pillar columns includes a plurality of active pillars arranged at intervals along a second direction, in which the first direction is perpendicular to the second direction; and buried bit lines, located in bit line trenches, which are located at least in the well region and a partial thickness of the semiconductor substrate at the bottom of each of the active pillars.

BRIEF DESCRIPTION OF THE DRAWINGS

In the drawings (which are not necessarily drawn to scale), similar reference numerals may describe similar parts in different views. Similar reference numerals with different letter suffixes may denote different examples of similar parts. The accompanying drawings generally illustrate the various embodiments discussed herein by way of example and not limitation.

LIST OF REFERENCE NUMERALS

Figure 1:
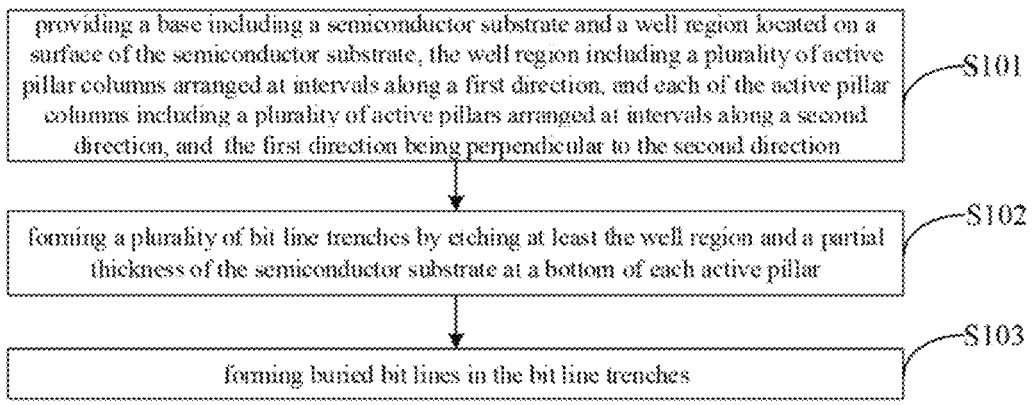
FIG. 1 is a flowchart of a method for forming a semiconductor structure provided by the embodiments of the disclosure.

200—semiconductor substrate; 201—well region; 202—patterned mask layer; 201a—active pillar; 203—first insulating material; 204—second insulating material; 205—barrier layer; 206—buried bit line; 207—gate oxide layer; 208—word line metal layer; 209—buried word line; 210—top insulating layer; A—third etching groove; B—first etching groove; C1—trench of first bit line; C2—trench of second bit line; D—second etching groove; E-fourth etching groove.

DETAILED DESCRIPTION

Exemplary embodiments of the disclosure will be described in more detail below with reference to the accompanying drawings. Although the exemplary embodiments of the disclosure are shown in the accompanying drawings, it should be understood that the disclosure may be implemented in various forms, and should not be limited by the specific embodiments set forth herein. On the contrary, these embodiments are provided to enable a more thorough understanding of the disclosure and to fully convey the scope of the disclosure to those skilled in the art.

In the following description, numerous specific details are given to provide a more thorough understanding of the disclosure. However, it will be apparent to those skilled in the art that the disclosure may be practiced without one or more of these details. In other examples, some technical features well known in the art are not described in order to avoid confusion with the disclosure, that is, not all features of the actual embodiments are described herein and well-known functions and structures are not described in detail.

In the figures, the dimensions of layers, regions, elements and their relative dimensions may be exaggerated for clarity. The same reference numerals denote the same elements throughout the text.

It should be understood that when an element or layer is referred to as "on", "adjacent to", "connected to" or "coupled to" another element or layer, it may be directly on, adjacent to, connected to, or coupled to the other element or layer, or may exist intervening elements or layers. Conversely, when an element is called "directly on", "directly adjacent to", "directly connected to" or "directly coupled to" another element or layer, there is no intervening element or layer. It should be understood that, although the terms first, second, third, etc. may be used to describe various elements, components, regions, layers, and/or portions, the elements, components, regions, layers, and/or portions should not be limited by such terms. These terms are used only to distinguish one element, component, region, layer, or portion from another element, component, region, layer, or portion. Thus, a first element, component, region, layer, or portion discussed below may be represented as a second element, component, region, layer, or portion without departing from the teachings of the disclosure. The discussion of a second element, component, region, layer or portion does not imply that a first element, component, region, layer or portion is necessarily present in the disclosure.

The terminology used herein is intended to describe specific embodiments only and is not to be a limitation of the disclosure. As used herein, the singular forms of "a", "an" and "said/the" are also intended to include the plural forms, unless the context clearly indicates otherwise. It should also be understood that the terms "compose" and/or "include", when used in this specification, determine the presence of said features, integers, steps, operations, elements and/or components, but do not exclude the presence or addition of one or more other features, integers, steps, operations, elements, components and/or groups. As used herein, the term "and/or" includes any and all combinations of related listed items.

Based on the problems existing in the related art, the embodiments of the disclosure provide a semiconductor structure and a method for forming the same. The method for forming the semiconductor structure includes the following operations. A base is provided, which includes a semiconductor substrate and a well region located on a surface of the semiconductor substrate, in which the well region includes a plurality of active pillar columns arranged at intervals along a first direction, and each of the active pillar columns includes a plurality of active pillars arranged at intervals along a second direction, in which the first direction is perpendicular to the second direction. A plurality of bit line trenches are formed by etching at least the well region located at the bottom of each active pillar and a partial thickness of the semiconductor substrate. As such, the buried bit lines are formed in the bit line trenches, and the integration level of the formed semiconductor device is improved. In addition, the preparation process of the buried bit lines in the embodiments of the disclosure is simple, and the formed buried bit lines can be effectively conducted and have strong control capability.

An embodiment of the disclosure provides a method for forming a semiconductor structure. As shown in FIG. 1, the method for forming the semiconductor structure includes the following operations.

In S101, a base is provided, which includes a semiconductor substrate and a well region located on the surface of the semiconductor substrate, in which the well region includes a plurality of active pillar columns arranged at intervals along a first direction, and each of the active pillar columns includes a plurality of active pillars arranged at intervals along a second direction, and the first direction is perpendicular to the second direction.

In the embodiment of the disclosure, the base may be a structure formed after partially doping the semiconductor substrate. The semiconductor substrate may be a silicon substrate. The semiconductor substrate may also include other semiconductor elements such as germanium (Ge), or semiconductor compounds such as silicon carbide (SiC), gallium arsenide (GaAs), gallium phosphide (GaP), indium phosphide (InP), indium arsenide (InAs), or indium antimonide (InSb), or other semiconductor alloys such as silicon germanium (SiGe), arsenic gallium phosphide (GaAsP), indium aluminum arsenide (AlInAs), gallium aluminum arsenide (AlGaAs), indium gallium arsenide (GaInP), and/or indium gallium arsenide phosphide (GaInAsP) or combinations thereof. The well region may be an N well (N-well) or a P well (P-well).

The semiconductor substrate may include a top surface at a front surface and a bottom surface at a back surface opposite to the front surface. A direction perpendicular to the top surface and the bottom surface of the semiconductor substrate is defined as a third direction, ignoring the flatness of the top surface and the bottom surface. In the direction along the top surface and the bottom surface of the semiconductor substrate (that is, the plane where the semiconductor substrate is located), a first and a second direction intersecting each other (for example, perpendicular to each other) are defined. For example, an arrangement direction of multiple active pillar columns may be defined as a first direction. A planar direction of the semiconductor substrate may be determined based on the first and second directions. Here, the first direction, the second direction and the third direction are perpendicular to each other. In the embodiment of the disclosure, the first direction is defined as an X-axis direction, the second direction is defined as a Y-axis direction, and the third direction is defined as a Z-axis direction.

In S102, a plurality of bit line trenches are formed by etching at least the part of the well region at the bottom of each active pillar and a partial thickness of the semiconductor substrate.

In the embodiment of the disclosure, part of the well region is retained at the bottom of each active pillar, and the bit line trench is located at the bottom of each active pillar.

In S103, a buried bit line is formed in each of the bit line trenches.

Figure 2A:
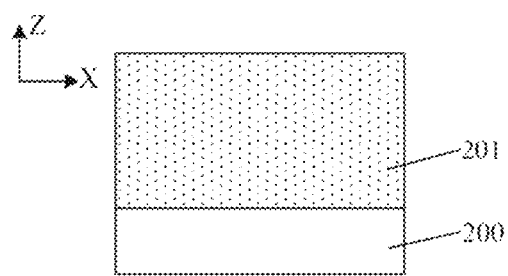
FIGS. 2A to 2P are scheme diagrams of a structure in a forming process of a semiconductor structure provided by an embodiment of the disclosure.
Figure 2B:
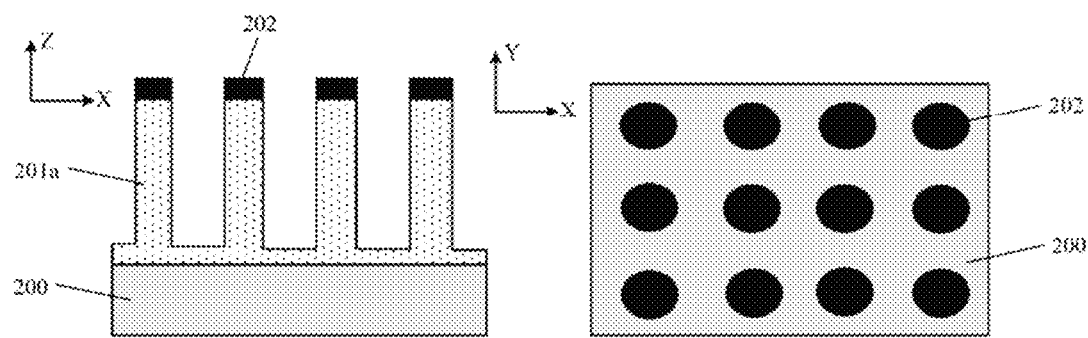
Figure 2C:
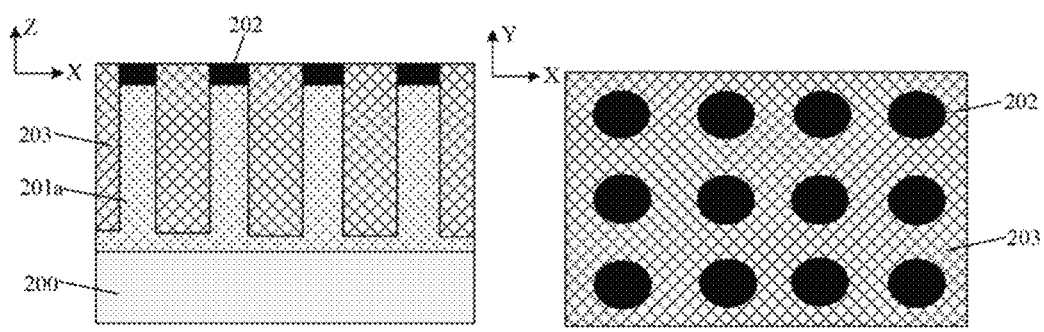
Figure 2D:
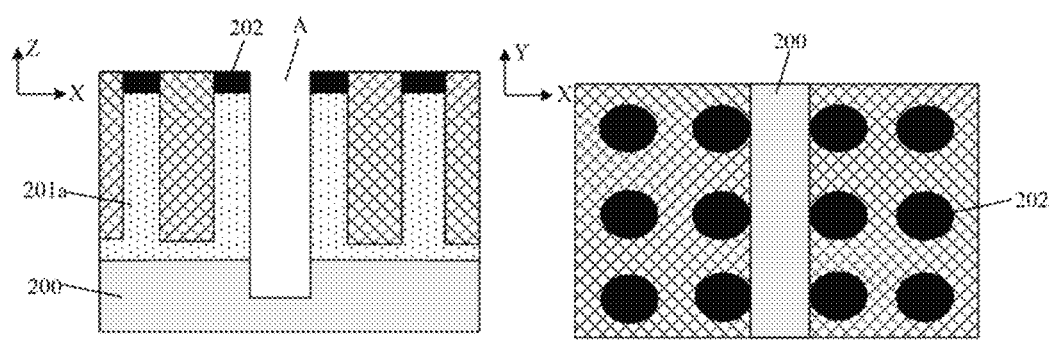
Figure 2E:
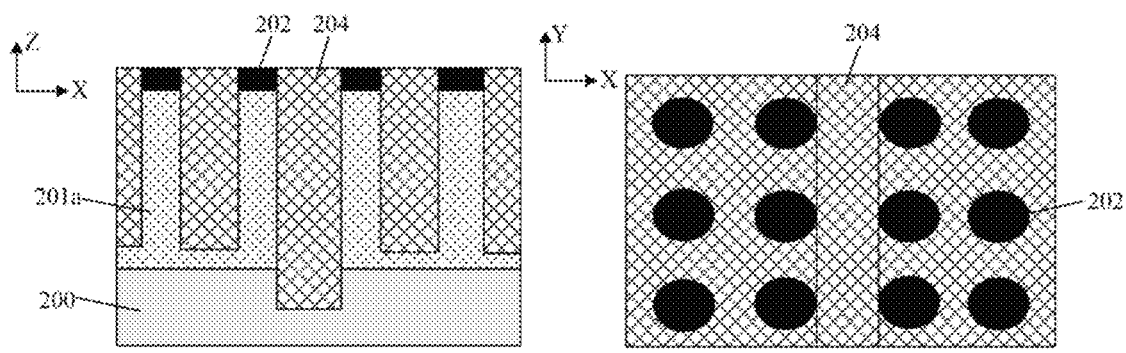
Figure 2F:
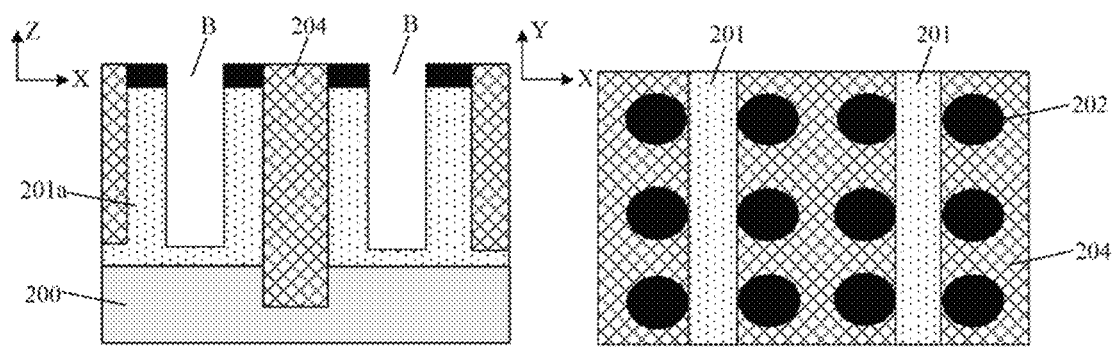
Figure 2G:
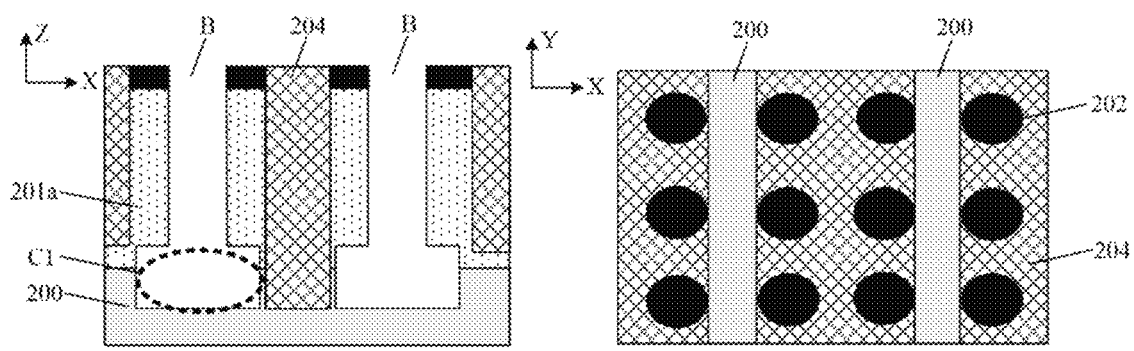
Figure 2H:
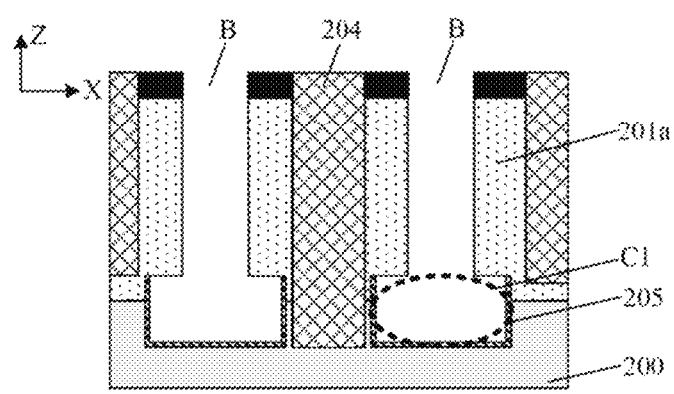
Figure 2I:
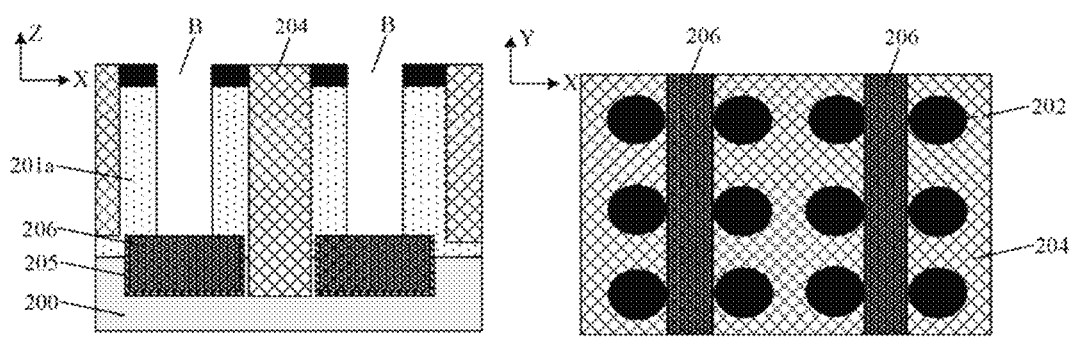
Figure 2J:
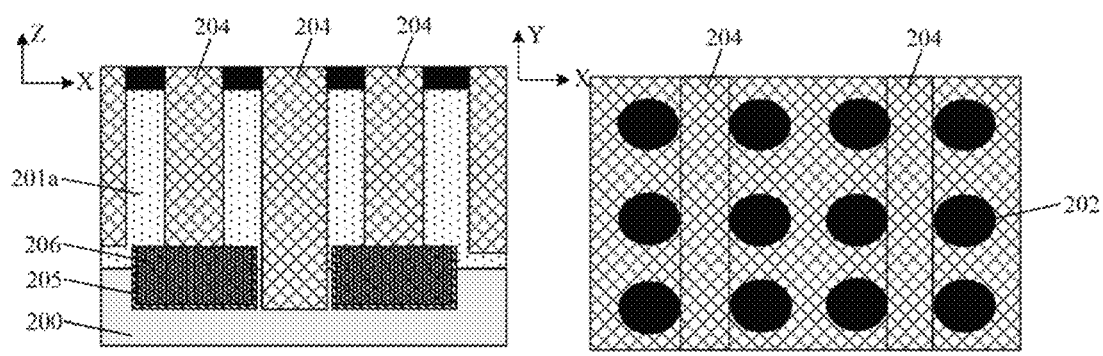
Figure 2K:
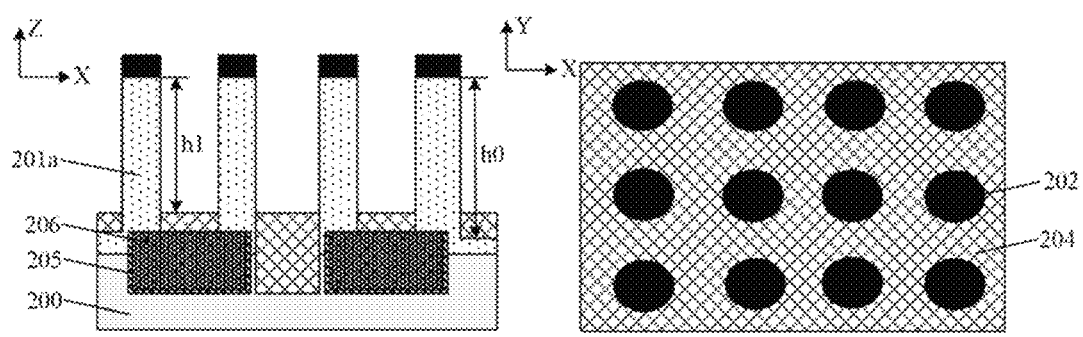
Figure 2L:
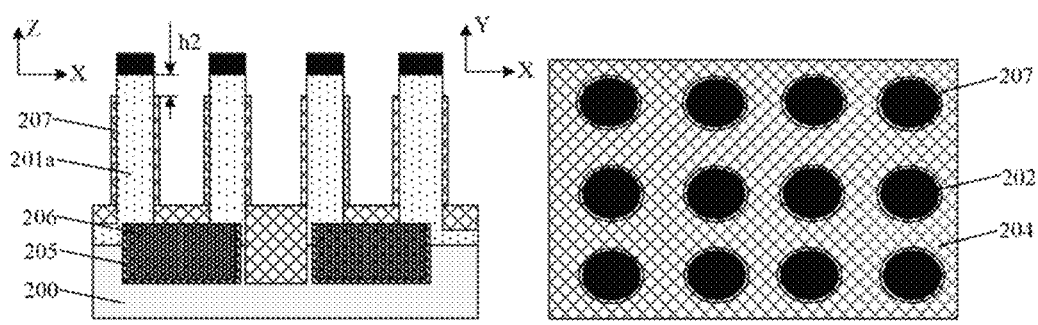
Figure 2M:
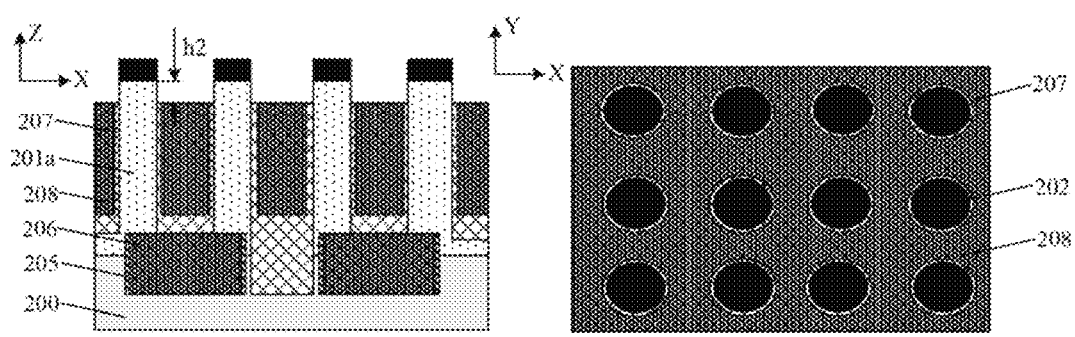
Figure 2N:
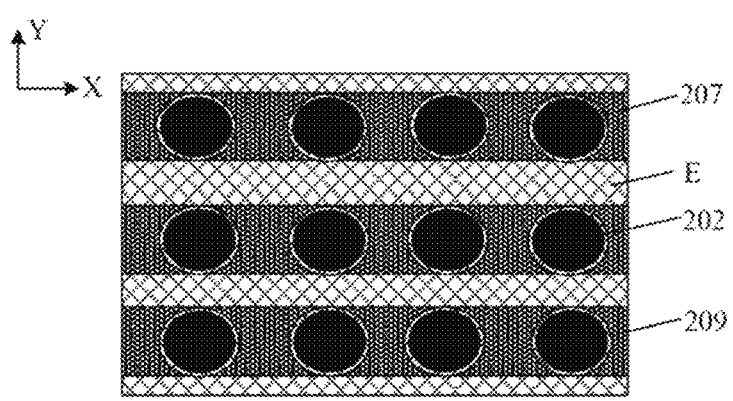
Figure 2O:
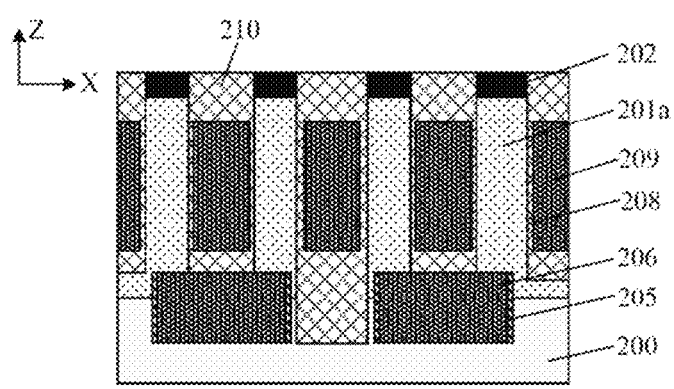
Figure 2P:
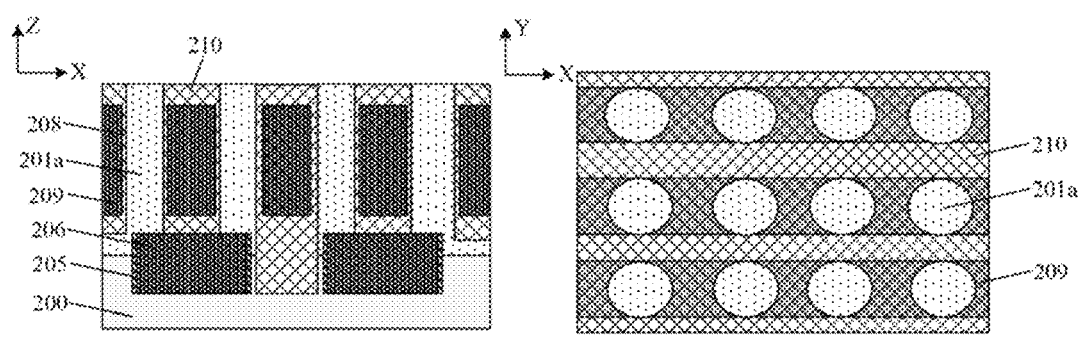

FIGS. 2A to 2P are scheme diagrams of a structure in the forming process of the semiconductor structure provided by an embodiment of this disclosure. Next referring to FIGS. 2A~2P, the method for forming the semiconductor structure provided in the embodiment of the disclosure is further described in detail.

First, with reference to FIGS. 2A and 2B, S101 is performed. A base is provided, which includes a semiconductor substrate and a well region located on a surface of the semiconductor substrate, in which the well region includes a plurality of active pillar columns arranged at intervals along a first direction, and each of the active pillar columns includes a plurality of active pillars arranged at intervals along a second direction, and the first direction is perpendicular to the second direction.

As shown in FIG. 2A, the base includes the semiconductor substrate 200 and the well region 201 located on the surface of the semiconductor substrate 200. In the embodiment of the disclosure, the semiconductor substrate may be a P-type substrate and the well region may be an N-well. In other embodiments, the semiconductor substrate may be an N-type substrate, and the well region may be a P-well.

In some embodiments, the active pillars located in the well region may be formed by the following operations.

A patterned mask layer is formed on a surface of the well region.

A partial thickness of the well region is etched through the patterned mask layer, to form multiple the active pillars arranged at intervals along the first direction and the second direction.

As shown in FIG. 2B, the patterned mask layer 202 is formed on the surface of the well region 201, and the well region 201 is etched through the patterned mask layer 202 in the Z-axis direction, to form the active pillars 201a arranged at intervals in the X-axis direction and the Y-axis direction. Multiple active pillars arranged at intervals along the Y-axis direction constitute an active pillar column, and multiple active pillar columns are arranged at intervals along the X-axis direction.

In some embodiments, after forming the active pillars, the method for forming the semiconductor structure further includes the following operations.

In S20, a first insulating material is filled between any two adjacent ones of the active pillars.

The first insulating material may be any kind of insulating material, for example, silicon oxide, silicon nitride, or silicon oxynitride.

As shown in FIG. 2C, a first insulating material 203 is filled between any adjacent active pillars 201a, in which the top surface of the first insulating material 203 is flush with the top surface of the patterned mask layer 202.

In step S21, every two adjacent active pillar columns are sequentially determined as an active pillar group.

Step S22, at least the first insulating material between two adjacent ones of the active pillar groups is etched, to form a plurality of third etching grooves, in which the bottoms of the third etching grooves are located inside the semiconductor substrate.

As shown in FIG. 2D, in the Z-axis direction, the first insulating material 203 between two adjacent active pillar groups, and the well region as well as the semiconductor substrate with a partial thickness located at the bottom of the first insulating material 203 between two adjacent active pillar groups are etched to form the third etching grooves A, bottoms of which are located inside the semiconductor substrate 200.

In the embodiment of the disclosure, the first insulating material, the well region, and the part of the semiconductor substrate may be etched by a dry etching process, such as a plasma etching process, a reactive ion etching process, or an ion milling process, to form the third etching grooves.

In S23, a second insulating material is filled in the third etching grooves.

The second insulating material may also be any insulating material, such as silicon oxide, silicon nitride or silicon oxynitride. The second insulating material and the first insulating material may be the same or different. In the embodiment of the disclosure, the second insulating material is the same as the first insulating material.

As shown in FIG. 2E, the second insulating material 204 is filled in the third etching grooves A.

Next, referring to FIGS. 2F and 2G, S102 is performed. A plurality of bit line trenches are formed by etching at least a well region at the bottom of each active pillar and a partial thickness of the semiconductor substrate.

In the embodiment of the disclosure, a bit line trench includes a first bit line trench. The first bit line trench may be formed by the following operations.

A plurality of first etching grooves are formed by etching the first insulating material between two adjacent active pillar columns in each active pillar group along a third direction, in which the third direction, the first direction and the second direction are perpendicular to each other.

As shown in FIG. 2F, the first insulating material 203 between two adjacent active pillar columns in each active pillar group is etched in the Z-axis direction to form the multiple first etching grooves B that expose the well region 201.

The first bit line trenches are formed by taking bottoms of the first etching grooves as an etching starting point, etching the well region and a partial thickness of the semiconductor substrate at bottoms of the first etching grooves along the third direction, and etching the well region and a partial thickness of the semiconductor substrate at bottoms of the active pillars along the first direction.

In the embodiment of the disclosure, with respect to etching the well region and the partial thickness of the semiconductor substrate at the bottoms of the active pillars, for each active pillar column, the whole well region and a partial thickness of the corresponding semiconductor substrate at the bottom of the active pillar may be etched, alternatively part of the well region and the partial thickness of the corresponding semiconductor substrate at the bottom of the active pillar may be etched along the X-axis direction.

As shown in FIG. 2G, the first bit line trenches C1 are formed by taking the bottoms of the first etching grooves B as the etching starting point, etching the well region and the partial thickness of the semiconductor substrate at the bottoms of the first etching grooves B in the Z-axis direction, and etching the well region and the partial thickness of the semiconductor substrate at the bottoms of the active pillars in the X-axis direction.

In the embodiment of the disclosure, when the first bit line trenches C1 are formed, the etching in the X-axis direction may be wet etching or biased dry lateral etching.

In some embodiments, before etching to form the first bit line trenches, the method for forming the semiconductor structure may further include forming a protective layer on the sidewalls of two adjacent active pillars along the first direction in each of the active pillar groups. The protective layer is configured to protect the active pillars from damage during etching to form the first bit line trenches. After forming the first bit line trenches, the protective layer needs to be removed.

Next with reference to FIGS. 2H and 2I, S103 is performed. A buried bit line is formed in each of the bit line trenches.

In the embodiment of the disclosure, the bit line trench includes a first bit line trench, and in the bit line trench, the buried bit line is formed, including the following operations.

A bit line metal material is deposited in the first bit line trenches to form the buried bit lines.

The bit line metal material includes tungsten (W), cobalt (Co), copper (Cu), aluminum (Al), polysilicon, doped silicon, silicide, or any combination thereof.

In some embodiments, prior to depositing the bit line metal material in the first bit line trenches, the method further includes forming a barrier layer on each inner wall of the first bit line trenches.

The barrier layer is located between the bit line metal material and the semiconductor substrate, and between the bit line metal material and the well region. The barrier layer is configured to prevent diffusion of the bit line metal material into the semiconductor substrate or the well region.

In the embodiment of the disclosure, the barrier layer may be formed by any suitable depositing process, for example, a chemical vapor deposition (CVD) process, a physical vapor deposition (PVD) process, an atomic layer deposition (ALD) process, a spin coating process, or a coating process. The barrier layer may be a silicon nitride layer.

As shown in FIGS. 2H and 2I, the barrier layer 205 is formed in each of the first bit line trenches C1, and a bit line metal material is deposited in the first bit line trenches having the barrier layers 205 to form the buried bit lines 206.

In the embodiment of the disclosure, the buried bit lines located in the first bit line trench of the active pillar group is connected with each other at the bottoms of two adjacent active pillars along the first direction.

It should be noted that, in the embodiment of the disclosure, when the bit line metal material is deposited in the first bit line trenches, the bit line metal material is also deposited in the first etching grooves B, and then the bit line metal material deposited in the first etching grooves B needs to be back etched, so that only the bit line metal material located in the first bit line trenches C1 is retained as the buried bit lines.

It should be noted that there is no strict sequential relationship between the operations S21 to S23 and the processes of formation of the buried bit lines, and operations S21 to S23 can also be performed after forming the buried bit lines.

In some embodiments, after forming the buried bit lines in the first bit line trenches, the method for forming the semiconductor structure further includes filling the first etching grooves with a second insulating material.

As shown in FIG. 2J, the second insulating material 204 is filled in the first etching grooves B.

In some embodiments, after filling the second insulating material in the first etching grooves, the method of forming the semiconductor structure further includes the following operations.

The active pillars with a first preset height are exposed by etching part of the second insulating material between any two adjacent ones of the active pillars along the third direction, in which the first preset height is smaller than the initial height of the active pillars.

As shown in FIG. 2K, the first preset height h1 of the active pillars 201a are exposed by etching part of the second insulating material 204 between any two adjacent active pillars in the Z-axis direction, in which the first preset height h1 is smaller than the initial height h0 of the active pillars 201a. In the embodiment of the disclosure, the height difference between the initial height h0 and the first preset height h1 may be 10 nm to 50 nm.

The buried word lines are formed on the exposed sidewalls of the active pillars of the first preset height.

In some embodiments, forming the buried word lines on the exposed sidewalls of the active pillars of the first preset height includes the following operations.

A gate oxide layer is formed on the sidewall of each exposed active pillar of the first preset height.

A word line metal layer is formed by filling a word line metal material between any two adjacent ones of the active pillars having the gate oxide layers.

In the embodiment of the disclosure, the word line metal material may be titanium nitride, tungsten or a combination thereof.

The active pillars are exposed with a second preset height by back etching the gate oxide layers and the word line metal layer. The second preset height is less than the first preset height.

As shown in FIGS. 2I and 2M, the gate oxide layers 207 and the word line metal layer 208 are formed on the exposed sidewalls of the active pillars 201a of the first preset height and the active pillars having a second preset height h2 are exposed. The second preset height h2 is smaller than the first preset height h1. In the embodiment of the disclosure, the second preset height includes 10 nm to 50 nm.

It should be noted that, in the embodiment of the disclosure, the process of back etching the gate oxide layers and the word line metal layer can be carried out in two steps or simultaneously.

The word line metal layer is patterned to form the buried word lines.

In some embodiments, patterning of the word line metal layer to form the buried word lines includes the following operation. The buried word lines and fourth etching grooves extending along the first direction are formed by etching the word line metal layer along the third direction and retaining the word line metal layer between two adjacent ones of the active pillars in the first direction.

As shown in FIG. 2N, the word line metal layer 208 is etched in the Z-axis direction, and the word line metal layer between any two adjacent ones of the active pillars 201a in the X-axis direction is retained to form the buried word lines 209 and the fourth etching grooves E extending in the X-axis direction.

In some embodiments, the method for forming the semiconductor structure further includes the following operation. A third insulating material is filled between the fourth etching grooves and the active pillars exposed with the second preset height, to form a top insulating layer, in which the top surface of the top insulating layer is flush with top surface of the patterned mask layer.

The third insulating material may also be any kind of insulating material, such as silicon oxide, silicon nitride or silicon oxynitride. The third insulating material and the second insulating material may be the same or different. In the embodiment of the disclosure, the third insulating material, the second insulating material and the first insulating material are all the same.

As shown in FIG. 2O, the third insulating material is filled between the fourth etching grooves E and the active pillars exposed with the second preset height, to form the top insulating layer 210, the top surface of which is flush with the top surface of the patterned mask layer 202.

In some embodiments, the method for forming the semiconductor structure further includes the following operation. The patterned mask layer of the surface of each active pillar is removed, to expose the top surface of the active pillar.

As shown in FIG. 2P, the patterned mask layer 202 on the surfaces the active pillars is removed, the top surfaces of the active pillars 201a are exposed, and the top insulating layer 210 is treated with chemical mechanical polishing (CMP), such that the top surface of the top insulating layer 210 is flush with the top surfaces of the active pillars 201a.

In some embodiments, the method of forming the semiconductor structure further includes forming a capacitor structure on the top surface of each active pillar. The capacitor structure may be a pillar capacitor or a cup-shaped capacitor.

In a semiconductor structure formed by the method for forming the semiconductor structure provided by the embodiments of the disclosure, bit lines are buried in a semiconductor substrate, and the source and the drain of each transistor are respectively located at vertical ends of an active pillar, the source is connected to a buried bit line in the semiconductor structure, and the drain is connected with a formed capacitor structure. In the embodiments of the disclosure, the buried word lines have a gate-all-around structure, and voltage signal on the word lines can control transistors to be turned on or turned off, thereby reading data information stored in the capacitor structures through bit lines, or writing data information into the capacitor structures through the bit lines for storage.

In the semiconductor structure formed by the method for forming the semiconductor structure provided by the embodiments of the disclosure, adjacent transistors share one buried bit line, the structure and the preparation process of the bit lines are simple, and can be effectively conducted, thus not only improving the integration and electrical performance of the formed semiconductor structure, but also reducing the production cost of the semiconductor structure.

FIGS. 3A to 3K are scheme diagrams of another structure in a forming process of a semiconductor structure provided by an embodiment of this disclosure. Next referring to FIGS. 3A to 3K, and the forming method of the semiconductor structure provided by the embodiment of this disclosure is further described in detail.

First, S101 is performed. A base is provided, which includes a semiconductor substrate and a well region located on a surface of the semiconductor substrate, in which the well region includes a plurality of active pillar columns arranged at intervals along a first direction, and each of the active pillar columns includes a plurality of active pillars arranged at intervals along a second direction, in which the first direction is perpendicular to the second direction.

The implementation process of S101 is the same as the implementation process of S101 in the above-mentioned embodiment and will not be described here.

In some embodiments, after forming the active pillars, the method of forming the semiconductor structure further includes the following operations.

A first insulating material is filled between any two adjacent active pillars.

Every adjacent two active pillar columns is sequentially determined as an active pillar group.

At least the first insulating material between two adjacent ones of the active pillar groups is etched, to form a plurality of third etching grooves, in which bottoms of the third etching grooves are located inside the semiconductor substrate.

A second insulating material is filled in the third etching grooves.

Figure 3A:
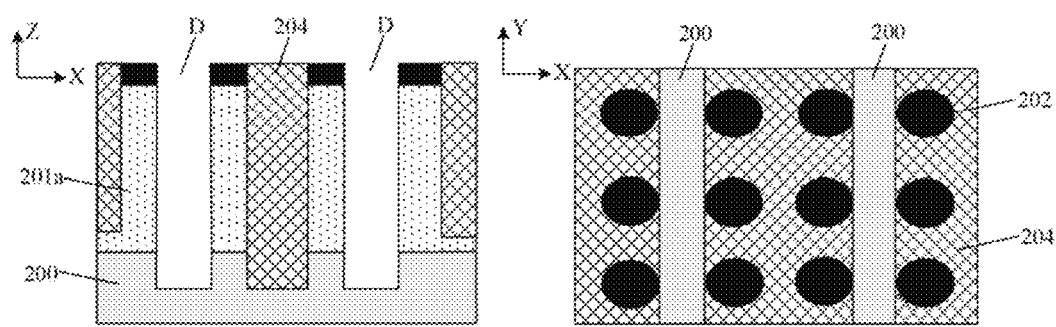
FIGS. 3A to 3K are scheme diagrams of another structures in a forming process of a semiconductor structure provided by an embodiment of the disclosure.
Figure 3B:
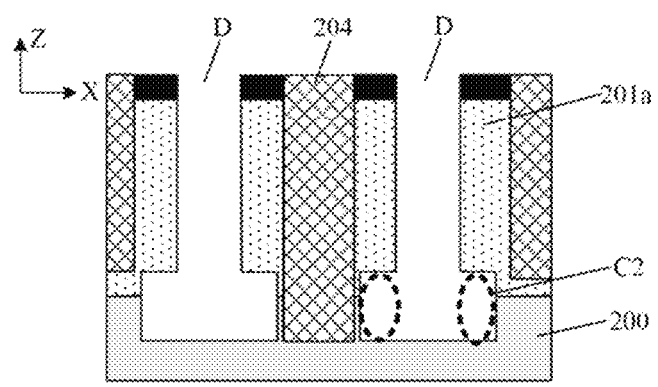

Next with reference to FIGS. 3A and 3B, S102 is performed. A plurality of bit line trenches are formed by etching at least the well region and a partial thickness of the semiconductor substrate located at the bottom of each active pillar.

In the embodiment of the disclosure, a bit line trench includes a second bit line trench. The second bit line trench may be formed by the following operations.

A plurality of second etching grooves are formed by etching the first insulating material between two adjacent active pillar columns in each active pillar group along a third direction, in which the third direction, the first direction and the second direction are perpendicular to each other.

As shown in FIG. 3A, the first insulating material 203 between two adjacent active pillar columns in each active pillar group, and the well region and a partial thickness of the semiconductor substrate located at the bottom of the first insulating material 203 between the adjacent two active pillars are etched in the Z-axis direction, to form multiple second etching grooves D, which expose the semiconductor substrate 200.

In the embodiment of the disclosure, the first insulating material, the well region and the part of the semiconductor substrate may be etched by a dry etching process, such as a plasma etching process, a reactive ion etching process, or an ion milling process, to form the second etching grooves.

The second bit line trenches are formed by etching the well region and a partial thickness of the semiconductor substrate at the bottoms of the active pillars along the first direction, in which the bottoms of the second bit line trenches are flush with the bottoms of the second etching grooves.

As shown in FIG. 3B, the well region and the partial thickness of the semiconductor substrate at the bottoms of the active pillars are etched in the X-axis direction, to form the second bit line trenches C2, the bottoms of which are flush with the bottoms of the second etching grooves D. In the embodiment of the disclosure, when forming the second bit line trenches C2, the etching in the X-axis direction may be wet etching or biased dry lateral etching.

In the embodiment of the disclosure, with respect to etching the well region and a partial thickness of the semiconductor substrate at the bottoms of the active pillars, for each active pillar column, a whole well region and a corresponding partial thickness of the semiconductor substrate at the bottom of each active pillar may be etched, alternatively part of well region and a corresponding partial thickness of the semiconductor substrate at the bottom of each active pillar may be etched along the X-axis direction.

Figure 3C:
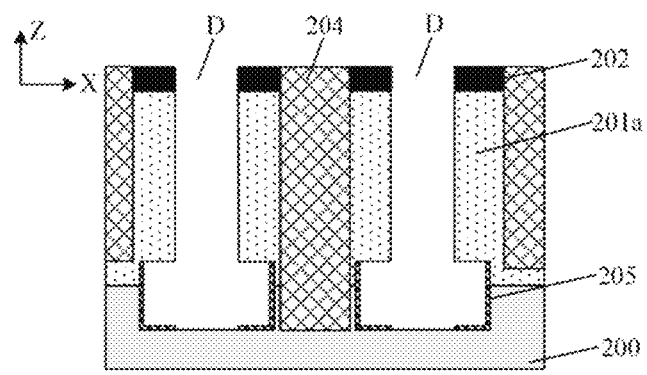
Figure 3D:
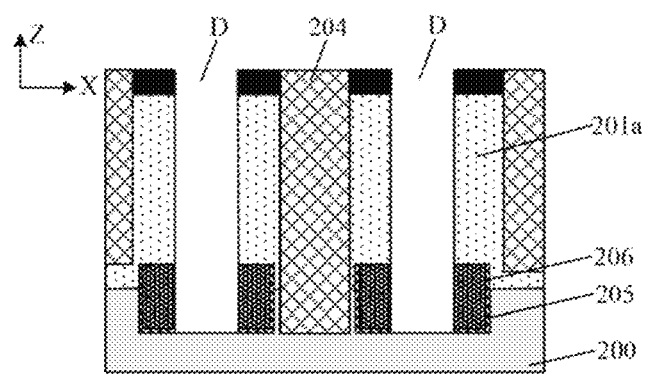

Next with reference to FIGS. 3C and 3D, S103 is performed. A buried bit line is formed in each bit line trench.

In the embodiment of the disclosure, the bit line trench includes a second bit line trench. In each bit line trench, a buried bit line is formed, including the following operation.

A bit line metal material is deposited in the second bit line trench to form the buried bit line.

In some embodiments, prior to deposition of the bit line metal material in the second bit line trenches, the method further includes forming a barrier layer on an inner wall of each second bit line trench.

The barrier layer is located between the bit line metal material and the semiconductor substrate, and between the bit line metal material and the well region. The barrier layer is configured to prevent diffusion of the bit line metal material into the semiconductor substrate or the well region.

As shown in FIGS. 3C and 3D, the barrier layer 205 is formed in each second bit line trench C2, and the bit line metal material is deposited in the second bit line trench having the barrier layer 205 to form the buried bit line 206.

In the embodiment of the disclosure, the buried bit lines located in the second bit line trench of one active pillar group are independent from each other at the bottoms of two adjacent active pillars along the first direction.

It should be noted that, in the embodiment of the disclosure, when the bit line metal material is deposited in the second bit line trenches, the bit line metal material is also partially deposited in the second etching grooves D, and then the bit line metal material deposited in the second etching grooves D needs to be etched back, so that only the bit line metal material located in the second bit line trenches C2 is retained as the buried bit lines.

In some embodiments, after forming the buried bit lines in the second bit line trenches, the method of forming the semiconductor structure further includes filling a second insulating material in the second etching grooves.

Figure 3E:
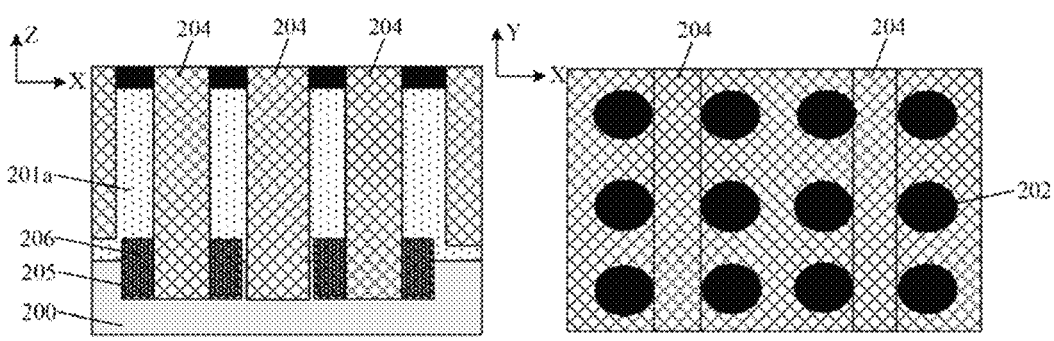

As shown in FIG. 3E, the second insulating material 204 is filled in the second etching grooves D.

In some embodiments, after filling the second insulating material in the second etching grooves, the method of forming the semiconductor structure further includes the following operation.

The active pillars are exposed with a first preset height by etching part of the second insulating material between any two adjacent ones of the active pillars along the third direction, in which the first preset height is less than the initial height of the active pillars.

Figure 3F:
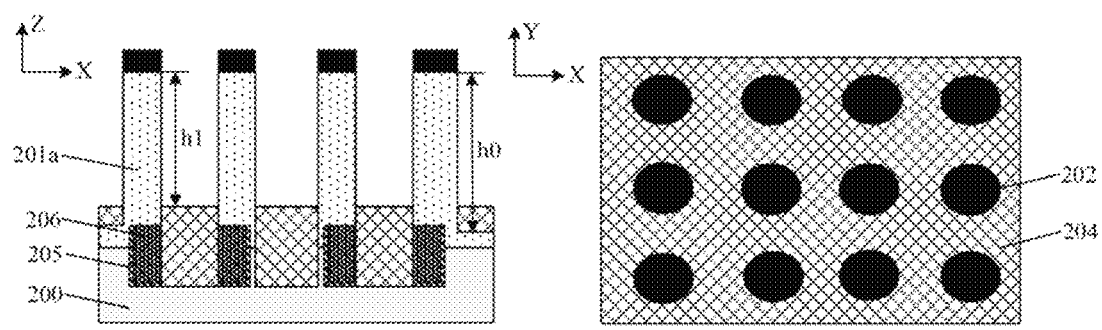

As shown in FIG. 3F, part of the second insulating material 204 between any two adjacent active pillars is etched in the Z-axis direction, to expose the active pillars 201a of the first preset height h1, in which the first preset height h1 is smaller than the initial height h0 of the active pillars 201a. In the embodiment of the disclosure, the height difference between the initial height h0 and the first preset height h1 may be 10 nm to 50 nm.

The buried word lines are formed on the exposed sidewalls of the active pillars of the first preset height.

In the embodiment of the disclosure, the process of forming the buried word lines on the exposed sidewalls of the active pillars of the first preset height is the same as that of the above-mentioned embodiment, and will not be described in detail herein.

Figure 3G:
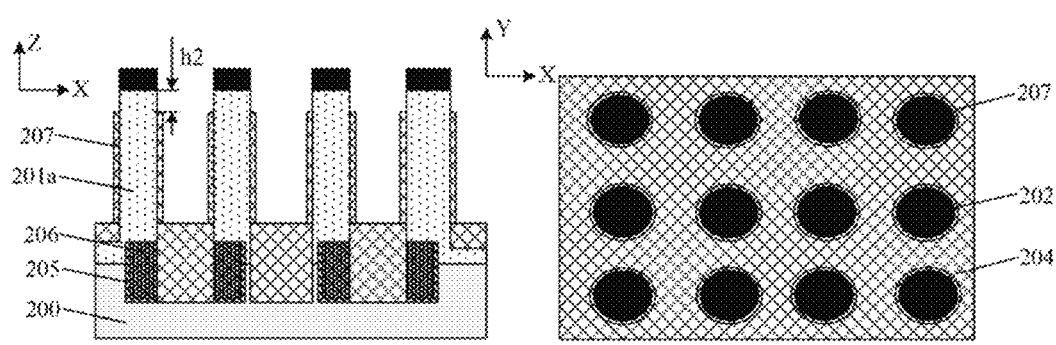
Figure 3H:
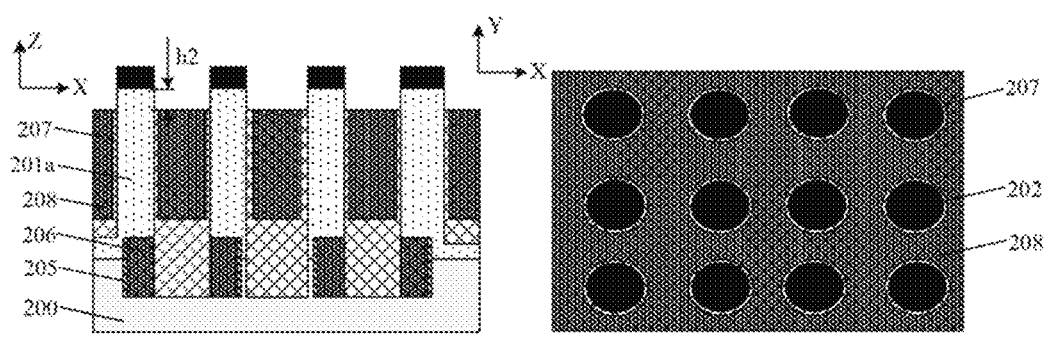

As shown in FIGS. 3G and 3H, the gate oxide layers 207 and the word line metal layer 208 are formed on the exposed sidewalls of active pillars 201a of the first preset height, and the active pillars is exposed with a second preset height h2. The second preset height h2 is smaller than the first preset height h1. In the embodiment of the disclosure, the second preset height includes 10 nm to 50 nm.

The word line metal layer is patterned to form the buried word lines.

In some embodiments, patterning the word line metal layer to form the buried word lines includes the following operation. The buried word lines and fourth etching grooves extending along the first direction are formed by etching the word line metal layer along the third direction and retaining the word line metal layer between two adjacent ones of the active pillars in the first direction.

Figure 3I:
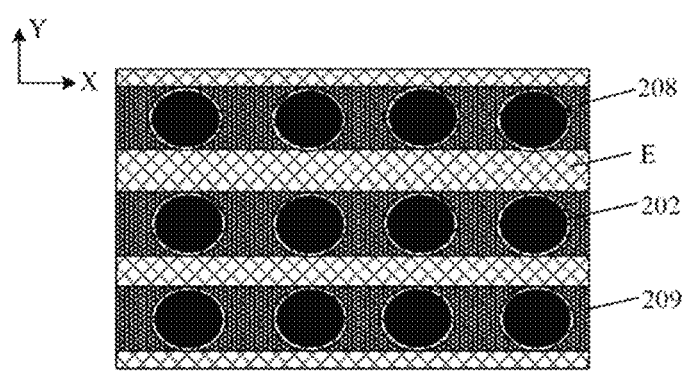

As shown in FIG. 3I, the word line metal layer 208 is etched in the Z-axis direction, and the word line metal layer between two adjacent ones of the active pillars 201a in the X-axis direction is retained to form the buried word lines 209 and the fourth etching grooves E extending in the X-axis direction.

In some embodiments, the method for forming the semiconductor structure further includes the following operation. A third insulating material is filled between the fourth etching grooves and the exposed active pillars of the second preset height, to form a top insulating layer, in which the top surface of the top insulating layer is flush with top surface of the patterned mask layer.

Figure 3J:
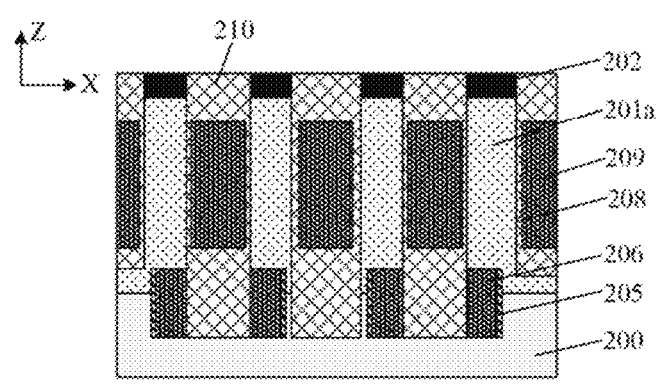

As shown in FIG. 3J, the third insulating material is filled in the fourth etching grooves E and between the exposed active pillars of the second preset height to form the top insulating layer 210, the top surface of which is flush with the top surface of the patterned mask layer 202.

In some embodiments, the method of forming the semiconductor structure further includes removing the patterned mask layer on the surfaces of the top active pillars, to expose the top surfaces of the active pillars.

Figure 3K:
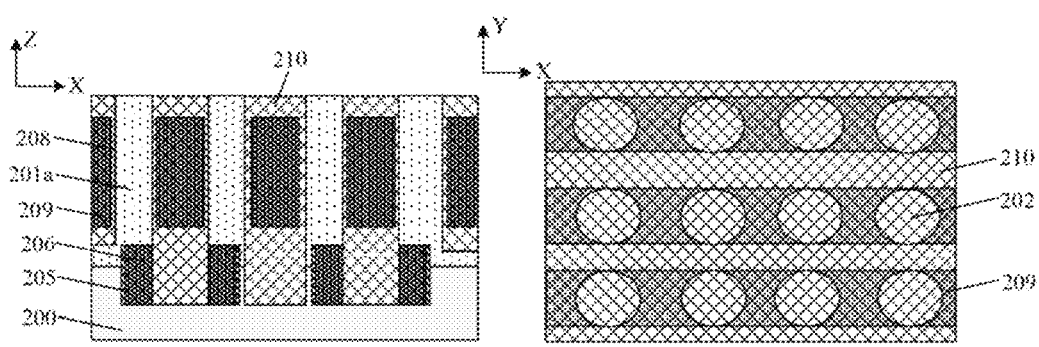

As shown in FIG. 3K, the patterned mask layer 202 on the active pillar surfaces is removed, the top surfaces of the active pillars 201a are exposed, and the top insulating layer 210 is treated with chemical mechanical polishing, so that the top surface of the top insulating layer 210 is flush with the top surfaces of the active pillars 201a.

In some embodiments, the method of forming the semiconductor structure further includes forming a capacitive structure on the top surface of each active pillar. The capacitance structure may be a pillar capacitor or a cup-shaped capacitor.

The method for forming a semiconductor structure provided by the embodiment of the disclosure is similar to the method for forming a semiconductor structure in the above-mentioned embodiment. For technical features not disclosed in detail by this embodiment of the disclosure, reference may be made to the above-mentioned embodiment for understanding, and the features will not be repeated herein.

In the semiconductor structure formed by the method for forming the semiconductor structure provided by the embodiment, each transistor has an independent buried bit line, the structure and preparation process of the bit line are simple and can be effectively conducted, thus not only improving the integration and electrical performance of such formed semiconductor structure, but also reducing the production cost of the semiconductor structure.

Figure 4A:
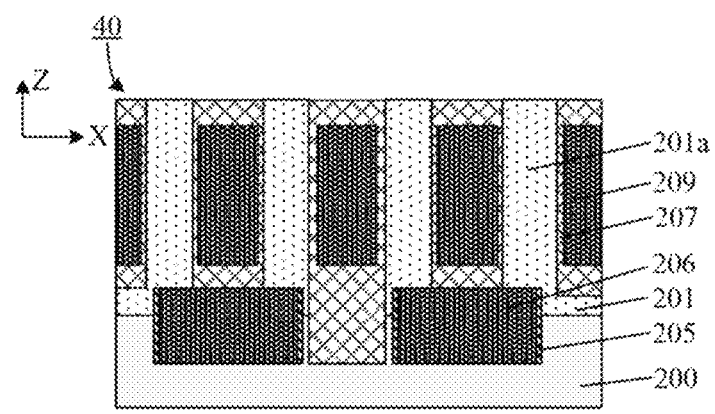
FIGS. 4A and 4B are cross-sectional views of semiconductor structures provided by the embodiments of the disclosure.
Figure 4B:
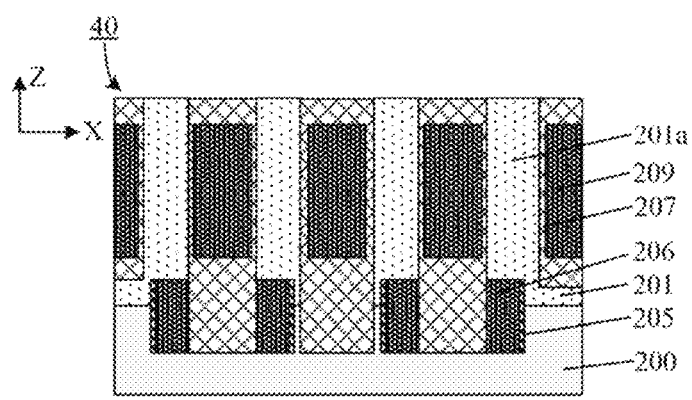

In addition, embodiments of the disclosure also provide a semiconductor structure formed by the method for forming a semiconductor structure provided by the above-mentioned embodiments. FIGS. 4A and 4B are cross-sectional views of the semiconductor structures provided by the embodiments of the disclosure. As shown in FIGS. 4A and 4B, an semiconductor structure 40 includes a substrate and buried bit lines 206.

The base includes a semiconductor substrate 200 and a well region 201 located on the surface of the semiconductor substrate 200. The well region 201 includes multiple active pillar columns arranged at intervals along the X-axis direction, and each of the active pillar columns includes multiple active pillars 201a arranged at intervals along the Y-axis direction (not shown in the figures).

The buried bit lines 206 are respectively located in the bit line trenches, and located at least in the well region and a partial thickness of the semiconductor substrate at the bottoms of the active pillars.

In the embodiments of the disclosure, the bit line trenches include first bit line trenches or alternatively second bit line trenches, and every two adjacent ones of the active pillar columns are determined as an active pillar group. The buried bit lines located in the first bit line trench of the active pillar group are connected with each other at the bottoms of two adjacent ones of the active pillars along the first direction (as shown in FIG. 4A); alternatively, the buried bit lines located in the second bit line trench of the active pillar group are independent from each other at the bottoms of two adjacent ones of the active pillars along the first direction (as shown in FIG. 4B).

In some embodiments, with continued reference to FIGS. 4A and 4B, the semiconductor structure 40 further includes a barrier layer 205 located between the semiconductor substrate and each buried bit line, and between the well region and the buried bit line. The barrier layer 205 is configured to prevent diffusion of the bit line metal material of the buried bit line into the semiconductor substrate or the well region.

In some embodiments, with continued reference to FIGS. 4A and 4B, the semiconductor structure 40 also includes a gate oxide layer 207 located on the sidewall of each active pillar and a buried word line 209 which forms an all-around gate structure of the semiconductor structure 40.

In some embodiments, the semiconductor structure further includes a capacitor structure (not shown in the figures) located on a surface of each active pillar.

The semiconductor structures in the embodiments of the disclosure are similar to the structures formed by the above-mentioned method for forming a semiconductor structures in the embodiment. For the technical features not disclosed in detail in the embodiments of the disclosure, reference may be made to the above-mentioned embodiments for understanding, and the features will not be repeated herein.

In the semiconductor structures provided by the embodiments of the disclosure, since the bit lines are buried inside the semiconductor substrate, the bit lines can be effectively conducted and have strong control ability, thereby improving the electrical performance of the formed semiconductor device. In addition, the buried bit lines formed in the embodiments of the disclosure can also improve the integration level of the semiconductor device and increase the application range of the semiconductor device.

Among the several embodiments provided in the disclosure, it should be understood that the disclosed apparatus and methods may be implemented in a non-target manner. The embodiments of the device described above are only schematic. For example, the division of the unit is only a logical function division, and there may be another division mode in actual implementation, such as: multiple units or assemblies may be combined, or integrated into another system, or some features may be omitted or not executed. In addition, the parts shown or discussed are coupled with each other, or directly coupled.

The units described above as separate parts may or may not be physically separated, and the parts shown as a unit may or may not be a physical unit, i.e. may be located in one place or may be distributed over multiple network units. According to actual needs, some or all of the units may be selected for the purpose of implementing solutions of the embodiments.

The features disclosed in several method embodiments or structure embodiments provided in the disclosure may be arbitrarily combined without conflict, to obtain a new method embodiment or structure embodiment.

The above are only some of the embodiments of the disclosure, but the scope of protection of embodiments of the disclosure is not limited thereto. Changes or replacements within the technical scope disclosed by the embodiments of the disclosure, easily conceived by a skilled person familiar with the technical field, should be covered within the protection scope of the embodiments of the disclosure. Therefore, the protection scope of embodiments in the disclosure shall be subject to the scope of protection of the claims.

INDUSTRIAL PRACTICALITY

Embodiments provide a semiconductor structure and a forming method thereof. The method for forming the semiconductor structure includes the following operations. A base is provided, which includes a semiconductor substrate and a well region located on a surface of the semiconductor substrate, in which the well region includes a plurality of active pillar columns arranged at intervals along a first direction, and each of the active pillar columns includes a plurality of active pillars arranged at intervals along a second direction, in which the first direction is perpendicular to the second direction. A plurality of bit line trenches are formed by etching at least the well region and a partial thickness of the semiconductor substrate at the bottom of each active pillar. Thus, the buried bit lines are formed in the bit line trenches, and the integration level of the formed semiconductor device is improved. In addition, the preparation process of the buried bit lines in the embodiments of the disclosure is simple, and the formed buried bit lines can be effectively conducted and have strong control capability.

What is claimed is:

1. A method for forming a semiconductor structure, comprising:
providing a base, which comprises a semiconductor substrate and a well region located on a surface of the semiconductor substrate, wherein the well region comprises a plurality of active pillar columns arranged at intervals along a first direction, and each of the active pillar columns comprises a plurality of active pillars arranged at intervals along a second direction, and wherein the first direction is perpendicular to the second direction;
forming a plurality of bit line trenches by etching at least the well region and a partial thickness of the semiconductor substrate at a bottom of each active pillar; and
forming buried bit lines in the bit line trenches.

2. The method for forming a semiconductor structure according to claim 1, wherein the bit line trenches comprise first bit line trenches, and the method further comprises:
determining sequentially every two adjacent active pillar columns as an active pillar group;
wherein the buried bit lines located in the first bit line trench of the active pillar group are connected with each other at bottoms of the two adjacent active pillars along the first direction.

3. The method for forming a semiconductor structure according to claim 2, wherein forming the buried bit lines in the bit line trenches comprises:
forming the buried bit lines by depositing a bit line metal material in the first bit line trenches.

4. The method for forming a semiconductor structure according to claim 3, wherein there is a first insulating material filled between any two adjacent ones of the active pillars, and forming the first bit line trenches comprises:
forming a plurality of first etching grooves by etching the first insulating material between the two adjacent active pillar columns in each of the active pillar groups along a third direction, wherein the third direction, the first direction and the second direction are perpendicular to each other; and
forming the first bit line trenches by taking bottoms of the first etching grooves as an etching starting point, etching the well region and a partial thickness of the semiconductor substrate at bottoms of the first etching grooves along the third direction, and etching the well region and the partial thickness of the semiconductor substrate at bottoms of the active pillars along the first direction.

5. The method for forming a semiconductor structure according to claim 4, further comprising:
filling a second insulating material in the first etching grooves, after the buried bit lines are formed in the first bit line trenches.

6. The method for forming a semiconductor structure according to claim 3, further comprising:
forming a barrier layer on an inner wall of each first bit line trench, before the bit line metal material is deposited in the first bit line trenches.

7. The method for forming a semiconductor structure according to claim 6, wherein forming the active pillars comprises:
  forming a patterned mask layer on a surface of the well region; and
  forming a plurality of the active pillars arranged at intervals along the first direction and the second direction by etching a partial thickness of the well region through the patterned mask layer.

8. The method for forming a semiconductor structure according to claim 7, wherein before forming the bit line trenches, the method further comprises:
  forming a plurality of third etching grooves by etching at least the first insulating material between two adjacent ones of the active pillar groups, wherein bottoms of the third etching grooves are located inside the semiconductor substrate; and
  filling a second insulating material in the third etching grooves.

9. The method for forming a semiconductor structure according to claim 8, further comprising:
  exposing the active pillars of a first preset height by etching part of the second insulating material between any two adjacent ones of the active pillars along the third direction, wherein the first preset height is less than the initial height of the active pillar; and
  forming buried word lines on exposed sidewalls of the active pillars of the first preset height.

10. The method for forming a semiconductor structure according to claim 9,
  wherein forming buried word lines on the exposed sidewalls of the active pillars of the first preset height comprises:
    forming gate oxide layers on the sidewalls of the exposed active pillars of the first preset height;
    forming a word line metal layer by filling a word line metal material between any two adjacent ones of the active pillars having the gate oxide layers;
    back etching the gate oxide layers and the word line metal layer to expose the active pillars of a second preset height, wherein the second preset height is less than the first preset height; and
    patterning the word line metal layer to form the buried word lines.

11. The method for forming a semiconductor structure according to claim 10, wherein patterning the word line metal layer to form the buried word lines comprises:
  forming the buried word lines and fourth etching grooves extending along the first direction by etching the word line metal layer along the third direction and retaining the word line metal layer between two adjacent ones of the active pillars in the first direction.

12. The method for forming a semiconductor structure according to claim 11, further comprising:
  filling a third insulating material in the fourth etching grooves and between the exposed active pillars of the second preset height to form a top insulating layer, wherein a top surface of the top insulating layer is flush with a top surface of the patterned mask layer.

13. The method for forming a semiconductor structure according to claim 12, further comprising:
  removing the patterned mask layer on a surface of each active pillar to expose a top surface of the active pillar; and
  forming a capacitor structure on the top surface of the active pillar.

* * * * *